US009264938B2

(12) United States Patent
Perets et al.

(10) Patent No.: US 9,264,938 B2
(45) Date of Patent: Feb. 16, 2016

(54) ENHANCED BUFFERING OF SOFT DECODING METRICS

(71) Applicant: Marvell World Trade Ltd., St. Michael (BB)

(72) Inventors: Yona Perets, Ra'anana (IL); Daniel Yellin, Ra'anana (IL)

(73) Assignee: MARVELL WORLD TRADE LTD., St. Michael (BB)

( * ) Notice: Subject to any disclaimer, the term of this patent is extended or adjusted under 35 U.S.C. 154(b) by 54 days.

(21) Appl. No.: 14/147,540

(22) Filed: Jan. 5, 2014

(65) Prior Publication Data

US 2014/0192857 A1    Jul. 10, 2014

Related U.S. Application Data

(60) Provisional application No. 61/749,019, filed on Jan. 4, 2013.

(51) Int. Cl.
*H04W 28/06* (2009.01)
*H04L 1/18* (2006.01)
*H04L 1/00* (2006.01)
*H04L 29/06* (2006.01)
*H03M 13/00* (2006.01)
*H03M 7/30* (2006.01)

(52) U.S. Cl.
CPC ............... *H04W 28/06* (2013.01); *H03M 7/30* (2013.01); *H03M 7/60* (2013.01); *H03M 13/6588* (2013.01); *H04L 1/00* (2013.01); *H04L 1/1819* (2013.01); *H04L 69/04* (2013.01); *H04L 1/1845* (2013.01)

(58) Field of Classification Search
CPC ..... H03M 13/6588; H03M 7/30; H03M 7/60; H03M 13/6505; H04L 1/00; H04L 69/04; H04L 1/1812; H04L 1/1845; H04L 25/067; H04L 1/1835; H04L 1/0045; H04L 1/1819; H04W 28/06; H04H 20/28; H04H 60/23
USPC .................................................. 714/780, 794
See application file for complete search history.

(56) References Cited

U.S. PATENT DOCUMENTS 5,566,191 A    10/1996 Ohnishi et al.
6,512,750 B1    1/2003 Palenius
6,590,860 B1 *  7/2003 Sakoda et al. ................ 370/203

(Continued)

FOREIGN PATENT DOCUMENTS

EP    0955736 A2    11/1999
EP    1898540 A1    3/2008

(Continued)

OTHER PUBLICATIONS

International Application PCT/IB2014/058023 Search Report May 14, 2014.

(Continued)

*Primary Examiner* — James C Kerveros

(57) ABSTRACT

A method includes, in a receiver, computing soft decoding metrics for decoding a received signal. The soft decoding metrics are stored in compressed form in a memory buffer. The soft decoding metrics in the compressed form are retrieved from the memory buffer, the retrieved soft decoding metrics are decompressed, and the received signal is decoded using the decompressed soft decoding metrics.

19 Claims, 3 Drawing Sheets

(56) References Cited

U.S. PATENT DOCUMENTS

| | | | |
|---|---|---|---|
| 6,757,319 | B1 | 6/2004 | Parsa et al. |
| 6,768,727 | B1 | 7/2004 | Sourour et al. |
| 7,039,846 | B2 * | 5/2006 | Hewitt et al. ............... 714/755 |
| 7,184,791 | B2 | 2/2007 | Nilsson et al. |
| 7,464,319 | B2 * | 12/2008 | Budge et al. ............... 714/762 |
| 8,099,139 | B1 | 1/2012 | Zaslavsky et al. |
| 8,150,478 | B2 | 4/2012 | Perets et al. |
| 8,429,482 | B1 * | 4/2013 | Payne et al. ............... 714/751 |
| 8,526,889 | B2 | 9/2013 | Pick et al. |
| 8,537,802 | B2 | 9/2013 | Erell et al. |
| 8,582,696 | B2 * | 11/2013 | Oh et al. ............... 375/341 |
| 8,751,913 | B2 * | 6/2014 | Li et al. ............... 714/786 |
| 2001/0019577 | A1 | 9/2001 | Ha |
| 2006/0045062 | A1 | 3/2006 | Gorokhov et al. |
| 2006/0274712 | A1 | 12/2006 | Malladi et al. |
| 2007/0110100 | A1 | 5/2007 | Wunder et al. |
| 2007/0141994 | A1 | 6/2007 | Cheng |
| 2007/0149229 | A1 | 6/2007 | Frederiksen et al. |
| 2007/0183591 | A1 | 8/2007 | Geile et al. |
| 2007/0253466 | A1 | 11/2007 | Jones et al. |
| 2007/0259671 | A1 | 11/2007 | Cheng et al. |
| 2008/0081655 | A1 | 4/2008 | Shin et al. |
| 2008/0098275 | A1 * | 4/2008 | Mitchell et al. ............... 714/748 |
| 2008/0108365 | A1 | 5/2008 | Buddhikot et al. |
| 2008/0207135 | A1 | 8/2008 | Varadarajan et al. |
| 2008/0229177 | A1 | 9/2008 | Kotecha |
| 2009/0163157 | A1 | 6/2009 | Zolfaghari |
| 2009/0224973 | A1 | 9/2009 | Nayyar |
| 2009/0257533 | A1 | 10/2009 | Lindoff et al. |
| 2009/0258628 | A1 | 10/2009 | Lindoff et al. |
| 2009/0264120 | A1 | 10/2009 | Karabinis |
| 2009/0279480 | A1 | 11/2009 | Rosenqvist et al. |
| 2009/0300456 | A1 | 12/2009 | Pelletier et al. |
| 2009/0316659 | A1 | 12/2009 | Lindoff et al. |
| 2009/0323846 | A1 | 12/2009 | Sindhushayana |
| 2010/0031122 | A1 * | 2/2010 | Laprade et al. ............... 714/763 |
| 2010/0172279 | A1 | 7/2010 | Chen et al. |
| 2012/0033767 | A1 | 2/2012 | Wilborn et al. |
| 2013/0047051 | A1 * | 2/2013 | Niewczas et al. ............. 714/751 |
| 2013/0198591 | A1 * | 8/2013 | Kamuf et al. ............... 714/780 |
| 2014/0281843 | A1 * | 9/2014 | Lo et al. ............... 714/807 |

FOREIGN PATENT DOCUMENTS

| | | |
|---|---|---|
| EP | 2012552 A1 | 1/2009 |
| WO | 97/02665 A2 | 1/1997 |
| WO | 00/01084 A1 | 1/2000 |

OTHER PUBLICATIONS

Research in Motion, UK Limited, "Uplink Power Control for Carrier Aggregation", 3GPP TSG RAN WG1 Meeting # 57b, Lon Angeles, USA, Jun. 29-Jul. 3, 2009.

Nokia Siemens Networks, "PUSCH Power Control for LTE-Advanced", 3GPP TSG RAN WG1 Meeting # 57bis, Los Angeles, USA, Jun. 29-Jul. 3, 2009.

3rd Generation Partnership Project; Technical Specification Group Radio Access Network; Radio Frequency (RF) System Scenarios (Release 5), 3GPP TR 25.942 V5.3.0, 79 pages, Sophia Antipolis, France, Jun. 2004.

Nokia Siemens Networks, "Autonomous Component Carrier Selection for LTE Advanced", 3GPP TSG RAN WG1 Meeting #54, Jeju Island, Korea, Aug. 18-22, 2008.

Nokia Siemens Networks, "Algorithms and Results for Autonomous Component Carrier Selection for LTE-Advanced", 3GPP TSG RAN WG1 Meeting #55, Prague, Czech Republic, Nov. 10-14, 2008.

Nokia Siemens Networks, "Use of Background Interference Matrix for Autonomous Component Carrier Selection for LTE-Advanced", 3GPP TSG RAN WG1 Meeting #55-bis, Ljubljana, Slovenia, Jan. 12-16, 2009.

Qualcomm Europe, Notion of Anchor Carrier in LTE-A, 3GPP TSG RAN WG1 Meeting #55-bis, Ljubljana, Slovenia, Jan. 12-16, 2009.

Samsung, "UL Transmission Power Control in LTE-A", 3GPP TSG RAN WG1 Meeting #56bis, Seoul, Korea, Mar. 23-27, 2009.

NTT Docomo et al., "Prioritized Deployment Scenarios for LTE-Advanced Studies", 3GPP TSG RAN WG4 Meeting #50, Athens, Greece, Feb. 9-13, 2009.

Nokia Siemens Networks, "LTE-Advanced SU-MIMO UE Transmission in LTE Release 8 Network", 3GPP TSG RAN WG1 Meeting #57, San Francisco, USA, May 4-8, 2009.

3rd Generation Partnership Project; Technical Specification Group Radio Access Network; Further Advancements for E-UTRA Physical Layer Aspects (Release 9), 3GPP TR 36.814 V0.4.1, 31 pages, Sophia Antipolis, France, Feb. 2009.

3rd Generation Partnership Project; Technical Specification Group Radio Access Network; Evolved Universal Terrestrial Radio Access (E-UTRA); Physical Later Procedures (Release 8), Draft 3GPP TS 36.213, V8.6.0, 58 pages, Sophia Antipolis, France, 2009.

Huawei, "The Impact of CA on Mobility in LTE-A", 3GPP TSG RAN WG1 Meeting #56, Athens, Greece, Feb. 9-13, 2009.

3rd Generation Partnership Project; Technical Specification Group Radio Access Network; Requirements for Further Advancements for Evolved Universal Terrestrial Radio Access (E-UTRA) (LTE-Advanced) (Release 8), 3GPP TR 36.913 V8.0.1, 15 pages, Sophia Antipolis, France, Mar. 2009.

3rd Generation Partnership Project; Technical Specification Group Radio Access Network; Evolved Universal Terrestrial Radio Access (E-UTRA); Physical layer procedures (Release 8), 3GPP TS 36.213, V8.4.0, 44 pages, Sophia Antipolis, France, Sep. 2008.

Nortel, "On the discussions of carrier aggregations", 3GPP TSG-RAN Working Group 1 Meeting #55, Prague, Czech Republic, Nov. 10-14, 2008.

NTT Docomo, Inc., "Updated Views on Support of Wider Bandwidth in LTE-Advanced", 3GPP TSG RAN WG1 Meeting #54bis, Prague, Czech Republic, Sep. 29-Oct. 3, 2008.

3rd Generation Partnership Project; Technical Specification Group Radio Access Network; User Equipment (UE) radio transmission and reception (FDD) (Release 8), 3GPP TS 25.101, V8.5.1, 214 pages, Sophia Antipolis, France, Jan. 2009.

Ericsson, "Carrier Aggregation in LTE-Advanced", TSG-RAN WG1 #53bis, Warsaw, Poland, Jun. 30-Jul. 4, 2008.

Alcatel-Lucent, "Fractional power Control using Pilot Power Ratio Measurements for the E-UTRA Uplink", 3GPP TSG-RAN WG1 #48, St. Louis, USA, Feb. 12-16, 2007.

Motorola, "Uplink Power Control for E-UTRA", 3GPP TSG RAN1 #48, St. Louis, USA, Feb. 12-16, 2007.

Motorola, "Interference Mitigation via Power Control and FDM Resource Allocation and UE Alignment for E-UTRA Uplink and TP", 3GPP TSG RAN1 #44, Denver, USA, Feb. 13-17, 2006.

Rapporteur (NTT DOCoMo), "Text proposal for RAN1 TR on LTE-Advanced", 3GPP TSG RAN WG1 Meeting #53bis, Warsaw, Poland, Jun. 30-Jul. 4, 2008.

International Application PCT/IB2011/052803 Search Report dated Dec. 2, 2011.

NTT Docomo, Inc.,"Proposals for LTE-Advanced Technologies", 3GPP TSG RAN WG1 Meeting # 53, Kansas City, USA, May 5-9, 2008.

Jarot et al., "Each Carrier Transmission Power Control for the Reverse Link of IFDM-DS-CDMA System", IEICE Transactions on Communications, vol. E82-B, No. 11, pp. 1851-1857, Nov. 1, 1999.

3rd Generation Partnership Project; Technical Specification Group Radio Access Network; Evolved Universal Terrestrial Radio Access (E-UTRA); User Equipment (UE) radio access capabilities (Release 9), 3GPP TS 36.306 V9.2.0, 16 pages, Sophia Antipolis, France, Jun. 2010.

* cited by examiner

ENHANCED BUFFERING OF SOFT DECODING METRICS

CROSS-REFERENCE TO RELATED APPLICATIONS

This application claims the benefit of U.S. Provisional Patent Application 61/749,019, filed Jan. 4, 2013, whose disclosure is incorporated herein by reference.

FIELD OF THE DISCLOSURE

The present disclosure relates generally to wireless communication, and particularly to methods and systems for processing of decoding metrics in a receiver.

BACKGROUND

Some communication receivers decode received signals using soft decoding metrics, and buffer the soft decoding metrics for later use. For example, Evolved Universal Terrestrial Radio Access (E-UTRA) systems use a Hybrid Automatic Repeat Request (HARQ) retransmission mechanism in which the receiver buffers soft decoding metrics in a buffer. Buffering capabilities for E-UTRA User Equipment (UE) are specified, for example, in "Technical Specification Group Radio Access Network; Evolved Universal Terrestrial Radio Access (E-UTRA); User Equipment (UE) radio access capabilities (Release 9)," version 9.2.0, June, 2010, which is incorporated herein by reference.

U.S. Pat. No. 8,526,889, whose disclosure is incorporated herein by reference, describes a method in a receiver including receiving from a transmitter an aggregated-spectrum signal including at least first and second component carriers in respective spectral bands. Information related to processing one or more of the component carriers is buffered in at least one shared buffer, such that storage locations in the shared buffer are selectably assignable for storing at least first information related to the processing of the first component carrier and second information related to the processing of the second component carrier. The one or more of the component carriers are processed in the receiver using the information buffered in the shared buffer.

The description above is presented as a general overview of related art in this field and should not be construed as an admission that any of the information it contains constitutes prior art against the present patent application.

SUMMARY

An embodiment that is described herein provides a method including, in a receiver, computing soft decoding metrics for decoding a received signal. The soft decoding metrics are stored in compressed form in a memory buffer. The soft decoding metrics in the compressed form are retrieved from the memory buffer, the retrieved soft decoding metrics are decompressed, and the received signal is decoded using the decompressed soft decoding metrics.

In some embodiments, storing the soft decoding metrics in the compressed form includes encoding the soft decoding metrics using a compression codebook. In an embodiment, encoding the soft decoding metrics includes adapting the compression codebook depending on a statistical distribution of the soft decoding metrics. In another embodiment, encoding the soft decoding metrics includes selecting the compression codebook from a plurality of predefined compression codebooks based on a property of the received signal.

In a disclosed embodiment, storing the soft decoding metrics in the compressed form includes indicating unoccupied regions in the memory buffer, and retrieving the compressed soft decoding metrics includes skipping the indicated regions. In an embodiment, the receiver includes a downlink receiver of a mobile communication terminal. In an alternative embodiment, the receiver includes an uplink receiver of a base station.

There is additionally provided, in accordance with an embodiment that is described herein, a telecommunication apparatus including a memory and processing circuitry. The memory is configured to hold a memory buffer for storing soft decoding metrics. The processing circuitry is configured to compute the soft decoding metrics for decoding a received signal, to store the soft decoding metrics in a compressed form in the memory buffer, to retrieve the soft decoding metrics in the compressed form from the memory buffer, to decompress the retrieved soft decoding metrics and to decode the received signal using the decompressed soft decoding metrics.

In an embodiment, a mobile communication terminal includes the disclosed apparatus. In another embodiment, a base station includes the disclosed apparatus. In some embodiments, a chipset for processing signals includes the disclosed apparatus.

There is also provided, in accordance with an embodiment that is described herein, a method including, in a receiver, computing soft decoding metrics, wherein each soft decoding metric belongs to one of multiple decoding processes of a received signal. A common region and multiple process-specific regions corresponding respectively to the decoding processes are allocated in a memory buffer. Each soft decoding metric is divided into a most-significant portion and a least-significant portion, the most-significant portion is stored in the process-specific region corresponding to a decoding process to which the soft metric belongs, and the least-significant portion is stored in the common region. The received signal is decoded using at least the most significant portions of the soft decoding metrics stored in the memory buffer.

In some embodiments, decoding the received signal includes, when the least-significant portions of the soft decoding metrics of a given decoding process are available in the common region, decoding the received signal using both the most-significant portions and the least-significant portions of the soft decoding metrics of the given decoding process; and, when the least-significant portions of the soft decoding metrics of a given decoding process are not available in the common region, decoding the received signal using only the most-significant portions of the soft decoding metrics of the given decoding process.

There is further provided, in accordance with an embodiment that is described herein, a telecommunication apparatus including a memory and processing circuitry. The memory is configured to hold a memory buffer for storing soft decoding metrics, wherein each soft decoding metric belongs to one of multiple decoding processes of a received signal. The processing circuitry is configured to compute the soft decoding metrics, to allocate in the memory buffer a common region and multiple process-specific regions corresponding respectively to the decoding processes, to divide each soft decoding metric into a most-significant portion and a least-significant portion, to store the most-significant portion of each soft decoding metric in the process-specific region corresponding to the decoding process to which the soft metric belongs and to store the least-significant portion of each soft decoding metric in the common region, and to decode the received signal using at least the most significant portions of the soft decoding metrics stored in the memory buffer.

In an embodiment, a mobile communication terminal includes the disclosed apparatus. In another embodiment, a base station includes the disclosed apparatus. In some embodiments, a chipset for processing signals includes the disclosed apparatus.

The present disclosure will be more fully understood from the following detailed description of the embodiments thereof, taken together with the drawings in which:

DETAILED DESCRIPTION OF EMBODIMENTS

Embodiments that are described herein provide methods and systems for processing soft decoding metrics in communication receivers. The disclosed techniques reduce the memory size needed for buffering soft decoding metrics, and the communication bandwidth needed for storing and retrieving them from memory.

In the disclosed embodiments, the receiver stores soft decoding metrics in a buffer, for example for use in a Hybrid Automatic Repeat Request (HARQ) retransmission scheme that uses Chase combining and/or Incremental Redundancy (IR). The receiver typically executes one or more decoding processes, and the soft decoding metrics of each process are stored in a separate region in the buffer.

In some embodiments, the receiver stores the soft decoding metrics in a buffer in compressed form, taking advantage of the fact that soft decoding metrics tend to be highly compressible. In one example embodiment, the receiver compresses the soft decoding metrics using a codebook-based compression scheme such as a Huffman or Fano code. In another embodiment, the receiver skips all-zero regions in the buffer when retrieving soft decoding metrics, for example by maintaining a list of pointers that point to the start and end addresses of the all-zero regions. All-zero regions may comprise, for example, unoccupied regions that are not populated with actual soft decoding metrics.

In alternative embodiments, the receiver divides the buffer into process-specific regions and a common region that is shared by the various decoding processes. Each soft decoding metric (represented by multiple bits) is divided into a more significant (MSB) portion and a least significant (LSB) portion. Under normal conditions, the MSB portion is stored in the appropriate process-specific region and the LSB portion is stored in the common region. If the number of processes is exceedingly high, the common region may overflow, i.e., it may not have sufficient space for storing the LSB portions of new soft decoding metrics. The buffer, however, is configured to have a sufficient number of process-specific regions, and therefore at least the MSB portions can always be stored, in an embodiment. This buffering scheme prevents loss of soft decoding metrics in rare cases of buffer overflow. In such cases, the receiver experiences only slight degradation in performance, because decoding is performed using only the MSB portions of the metrics.

In summary, the methods and systems described herein reduce the size of the soft metric buffer and the communication bandwidth needed to access the buffer, in an embodiment. As a result, the size, cost and power consumption of the receiver can be reduced considerably.

Figure 1:
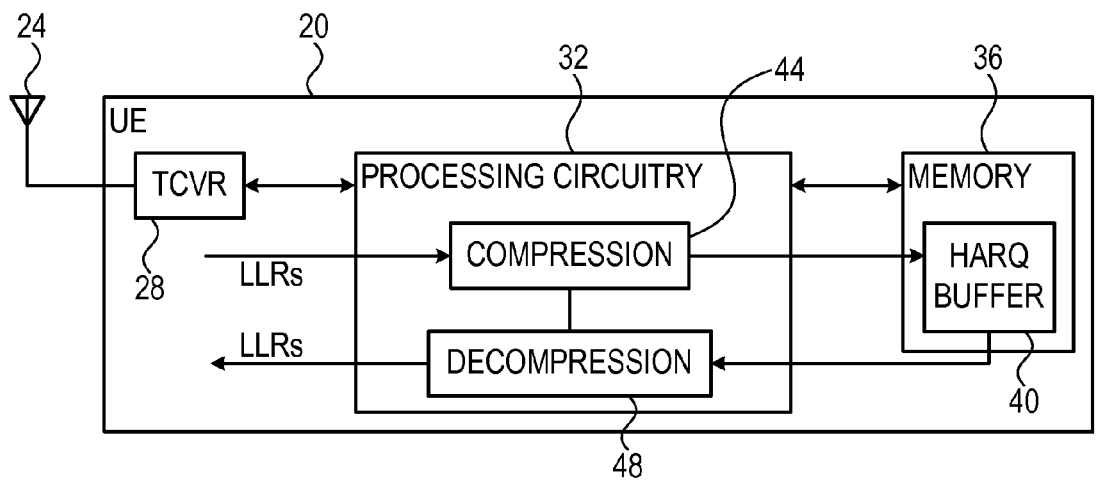
FIG. 1 is a block diagram that schematically illustrates a mobile communication terminal, in accordance with an embodiment that is described herein.

FIG. 1 is a block diagram that schematically illustrates a mobile communication terminal 20, in accordance with an embodiment that is described herein. Terminal 20 is also referred to as a User Equipment (UE). In the embodiments described herein, UE communicates in a cellular network operating in accordance with the Universal Mobile Telecommunications System (UMTS) or Evolved Universal Terrestrial Radio Access (E-UTRA, also referred to as LTE or LTE-A) specifications. Alternatively, however, UE 20 may operate in accordance with any other suitable cellular or non-cellular communication protocol.

UE 20 communicates with a base station (not shown in the figure), which is also referred to as NodeB or eNodeB. In the present example, UE 20 comprises an antenna 24 for transmitting and receiving Radio Frequency (RF) signals to and from the base station, a transceiver (TCVR) 28 that down-converts received downlink signals and up-converts uplink signals for transmission, processing circuitry 32 that carries out the various processing functions of the UE, and a memory 36 used for various storage purposes.

In the embodiment of FIG. 1, UE 20 uses a Hybrid Automatic Repeat Request (HARQ) scheme. In such a scheme, if the UE fails to decode certain data (e.g., a packet), the base station retransmits at least part of the data and decoding is reattempted. Example HARQ schemes are Chase combining and Incremental Redundancy (IR). In Chase combining, the base station retransmits the entire data, and the UE combines the soft decoding metrics of the initial transmission with the corresponding soft decoding metrics of the retransmission. In IR, the base station transmits additional redundancy bits in case of failure, and the UE re-attempts to decode the data using the soft decoding metrics of the initial redundancy bits and the soft decoding metrics of the additional redundancy bits. HARQ schemes that use both Chase combining and IR are also feasible. In either case, HARQ processing in the UE involves buffering of soft decoding metrics computed over a given transmission, and some form of joint processing of the buffered soft decoding metrics and new decoding metrics computed over a subsequent retransmission.

In the embodiments described herein the soft decoding metrics comprise Log Likelihood Ratios (LLRs), and the description that follows focuses on LLRs for the sake of clarity. The disclosed techniques, however, can be used with various other kinds of soft decoding metrics.

In some embodiments, UE 20 comprises a memory 36 that holds a HARQ buffer 40. Processing circuitry 32 comprises a compression unit 44 used for storing LLRs in buffer 40, and a decompression unit 48 used for retrieving LLRs from buffer 40. Using compression unit 44 and decompression unit 48, processing circuitry 32 stores the LLRs in buffer 44 in compressed form. Since the compressed LLRs are smaller in data size relative to the LLRs prior to compression, the size of buffer 40 can be reduced, and lower communication bandwidth is needed between processing circuitry 32 and memory 36.

In some embodiments, compression unit 44 compresses the LLRs using a codebook-based compression scheme, and stores the compressed LLRs in buffer 40. In a typical codebook-based compression scheme, each possible LLR value is represented by a respective code value, such that, on average, the size of the compressed data is smaller than the size of the original data. The assignment of code values to LLRs typically depends on the relative occurrence probabilities of the various LLR values, e.g., by assigning short code values to frequently-occurring LLR values and vice-versa. Any suitable codebook-based compression scheme, such as Huffman or Fano coding, can be used for this purpose.

Alternatively, in other embodiments processing circuitry 32 compresses the LLRs using any other suitable, lossless or lossy, compression scheme. The compression ratio of the compression scheme used by processing circuitry 32 typically depends on the LLR entropy and on the permitted performance degradation.

In some embodiments, when using codebook-based compression, the compression codebook is adapted dynamically depending on the statistical distribution of the soft decoding metrics. In an embodiment, processing circuitry 32 adapts the compression codebook to match the actual occurrence probabilities of the different data values. In an example embodiment, the processing circuitry tracks the actual occurrence probabilities of the different data values, and changes the compression codebook (i.e., the mapping between LLRs and code values) so as to retain a high compression ratio. In alternative embodiments, processing circuitry 32 may adapt the compression codebook based on the statistical distribution of the soft decoding metrics in any other suitable way.

In another embodiment, processing circuitry 32 selects the compression codebook from a set of predefined codebooks depending on a property of the received signal, e.g., depending on Signal to Noise Ratio (SNR), Modulation and Coding Scheme (MCS) or other suitable property.

In an example Chase-combining HARQ process, processing circuitry 32 computes the LLRs for a received re-transmitted data packet, retrieves the corresponding compressed LLRs from buffer 40, decompresses the retrieved LLRs using decompression unit 48, combines the LLRs of the re-transmitted packet with the respective LLRs retrieved from buffer 40, and re-attempts to decode the packet data using the combined LLRs. Processing circuitry 32 also sends the combined LLRs for storage in buffer 40, in preparation for possibly receiving another retransmission of the same packet.

Figure 2:
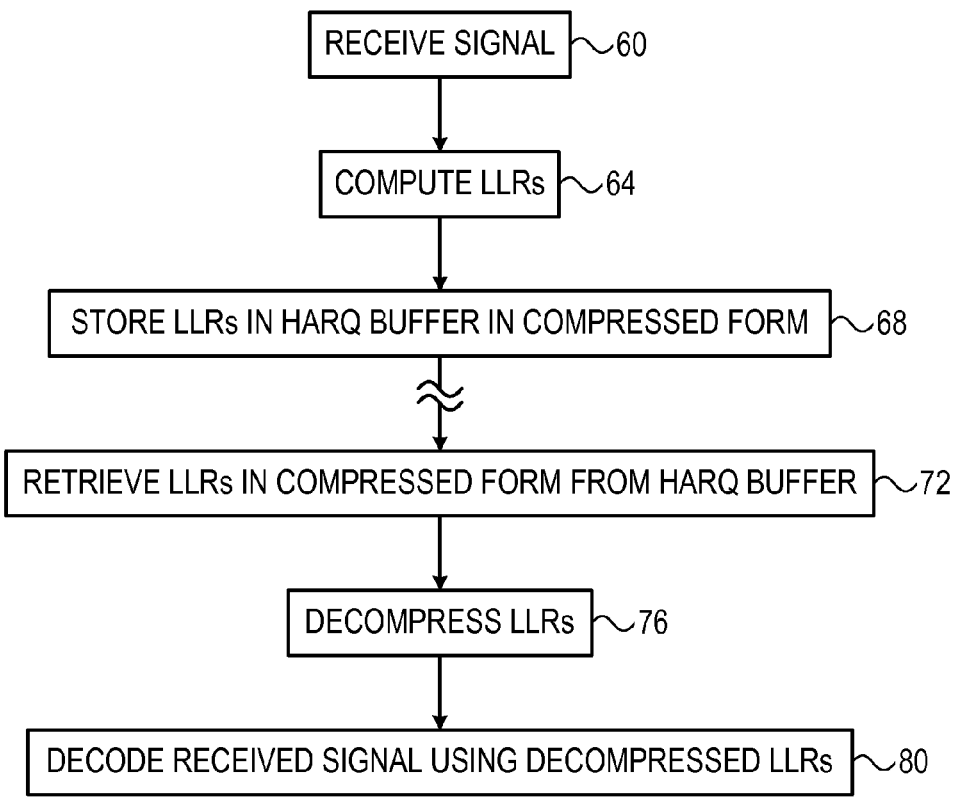
FIG. 2 is a flow chart that schematically illustrates a method for processing soft decoding metrics in a mobile communication terminal, in accordance with an embodiment that is described herein.

FIG. 2 is a flow chart that schematically illustrates a method for processing LLRs in UE 20, in accordance with an embodiment that is described herein. The method begins with transceiver 28 receiving a signal that carries data from a base station, at a signal receive operation 60. Processing circuitry 32 computes LLRs for the data carried by the received signal, at an LLR computation operation 64. Processing circuitry 32 stores the LLRs in HARQ buffer 40 in compressed form using compression unit 44, at a compressed storage operation 68.

When the stored LLRs are needed, e.g., for combining with newly-arriving LLRs, processing circuitry 32 retrieves the compressed LLRs from buffer 40, at a retrieval operation 72. Decompression unit 48 decompresses the LLRs, at a decompression operation 76. Processing circuitry 32 then attempts to decode the data carried by the received signal using the LLRs.

Figure 3:
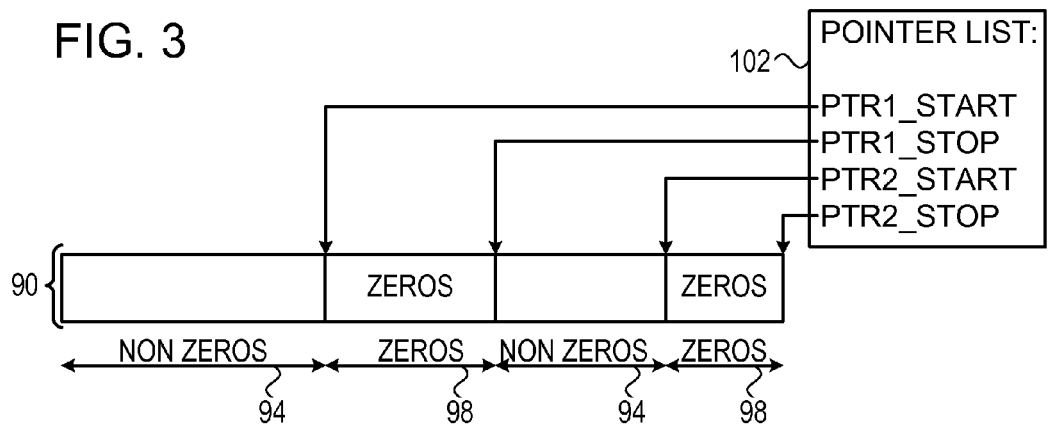
FIG. 3 is a diagram that schematically illustrates a compression scheme for soft decoding metrics, in accordance with an embodiment that is described herein.
Figure 3:
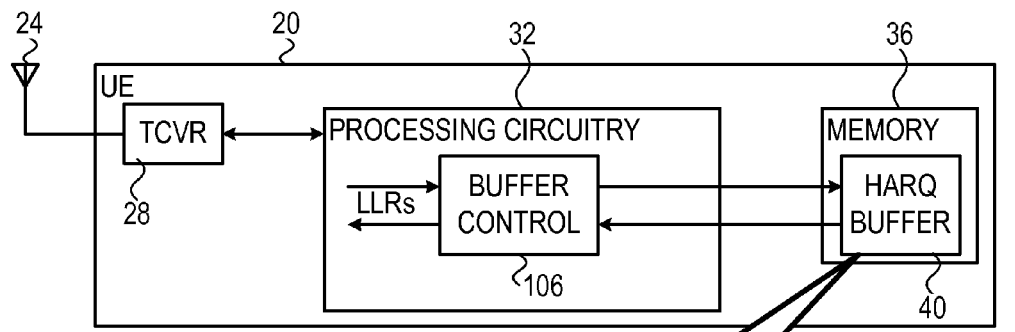

FIG. 3 is a diagram that schematically illustrates another compression scheme for soft decoding metrics, in accordance with an embodiment that is described herein. In this embodiment, processing circuitry 32 uses the fact that HARQ buffer 40 often contains extensive unoccupied regions, typically marked as all-zero data. All-zero regions occur, for example, when the size of the data to be buffered is smaller than the buffer size, or when the data to be buffered does not arrive all at once but in stages. The description that follows refers to all-zero regions, for the sake of clarity. In alternative embodiments, any other suitable way can be used to mark unoccupied regions of the buffer.

Regions of all-zero data are common, for example, when using HARQ based on Incremental Redundancy (IR). In IR schemes, the base station first sends the data with a certain number of redundancy bits. If the UE fails to decode the data using these redundancy bits, the base station sends additional redundancy bits, and the UE re-attempts to decode the data using both the initial redundancy bits and the additional redundancy bits. In a typical implementation, processing circuitry 32 reserves memory space in buffer 40 for the LLRs of the additional redundancy bits. Before a retransmission arrives, however, this reserved memory space is all-zero. Alternatively, however, buffer 40 may contain all-zero regions for any other reason.

The example of FIG. 3 shows the LLRs stored in buffer 40 at a certain point in time. The buffer in this example comprises non-zero regions 94 containing non-zero LLR values, and regions 98 containing all-zero data. Note that a non-zero region 94 may incidentally contain certain zero data values, but the region as a whole is non-zero.

In an embodiment, processing circuitry 32 maintains a list 102 of pointers that point to the start and end addresses of all-zero regions 98. In the present example, a pair of pointers {Ptr1_start, Ptr1_stop} respectively point to the start and end of the first all-zero region, and a pair of pointers {Ptr2_start, Ptr2_stop} respectively point to the start and end of the second all-zero region. In this embodiment, when retrieving LLRs from buffer 40, processing circuitry 32 identifies all-zero regions 98 using the pointers of list 102, and skips the identified regions. In other words, processing circuitry 32 retrieves only LLRs from non-zero regions 94 and thus refrains from unnecessarily reading and transferring zero data values that are not part of the actual data.

Figure 4:
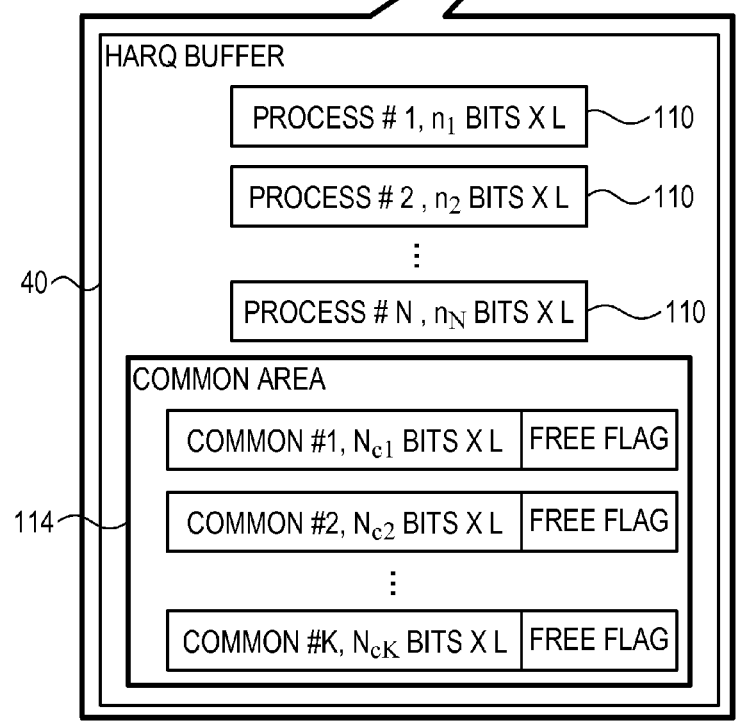
FIG. 4 is a block diagram that schematically illustrates a mobile communication terminal, in accordance with an alternative embodiment that is described herein.

FIG. 4 is a block diagram that schematically illustrates an alternative implementation of UE 20, in accordance with an alternative embodiment that is described herein. In this embodiment, processing circuitry 32 comprises a buffer control unit 106 that manages the buffering of LLRs in HARQ buffer 40.

In an embodiment, buffer control unit 106 divides the memory space of buffer 40 into multiple process-specific regions 110 and a common region 114. Each process-specific region 110 is dedicated to a specific decoding process, and is used for storing portions of LLRs associated with that process. Common region 114 is shared among the various decoding processes, i.e., used for storing portions of LLRs associated with any of the processes.

When buffering a set of LLRs computed for a given process, unit 106 divides each LLR into a more significant (MSB) portion and a least significant (LSB) portion, stores the MSB portions of the LLRs in the process-specific region and the LSB portions in the common region. The buffer memory space is partitioned such that the process-specific regions will not overflow, but the common region may overflow with small probability. In the example of FIG. 4, buffer 40 comprises N process-specific regions, and the common region is capable of storing LSB portions for K processes, K<N.

If the number of decoding processes is unusually high, the common region may not have sufficient space for storing additional LSB portions of LLRs. The number of process-specific regions, on the other hand, is chosen so that overflow will not occur. In the rare event of overflow in the common region, LLRs merely suffer degradation in quantization but are not entirely lost, because their MSB portions survive in the process-specific regions. This kind of partitioning enables considerable reduction in the overall size of buffer 40.

When the LLRs of a certain process are to be retrieved, buffer control unit 106 retrieves the MSB portions of the LLRs from the appropriate process-specific region 110, and (if available) retrieves the LSB portions of the LLRs from common region 114. Decoding is performed using either the complete LLRs, or using only the MSB portions. In any case, LLRs are not lost and decoding is possible. In rare cases of buffer overflow, decoding performance is slightly degraded due to the rough quantization of the LLRs.

Unit 106 divides the LLRs into MSB and LSB portions having any suitable sizes, in an embodiment. In one example embodiment, the buffer is defined with eight process-specific regions 110 for serving eight processes (i.e., N=8). The MSB portion of each LLR (and thus the bit-width of the process-specific regions) comprises a single bit. Common region 114 is dimensioned to store the LSB portions of up to two processes (i.e., K=2). The LSB portion of each LLR (and thus the bit-width of the common region) comprises four bits. In this example, the size of buffer 40 is only 40% of its conventional size (the size that would be needed for buffering LLRs of eight processes of comparable size).

Figure 5:
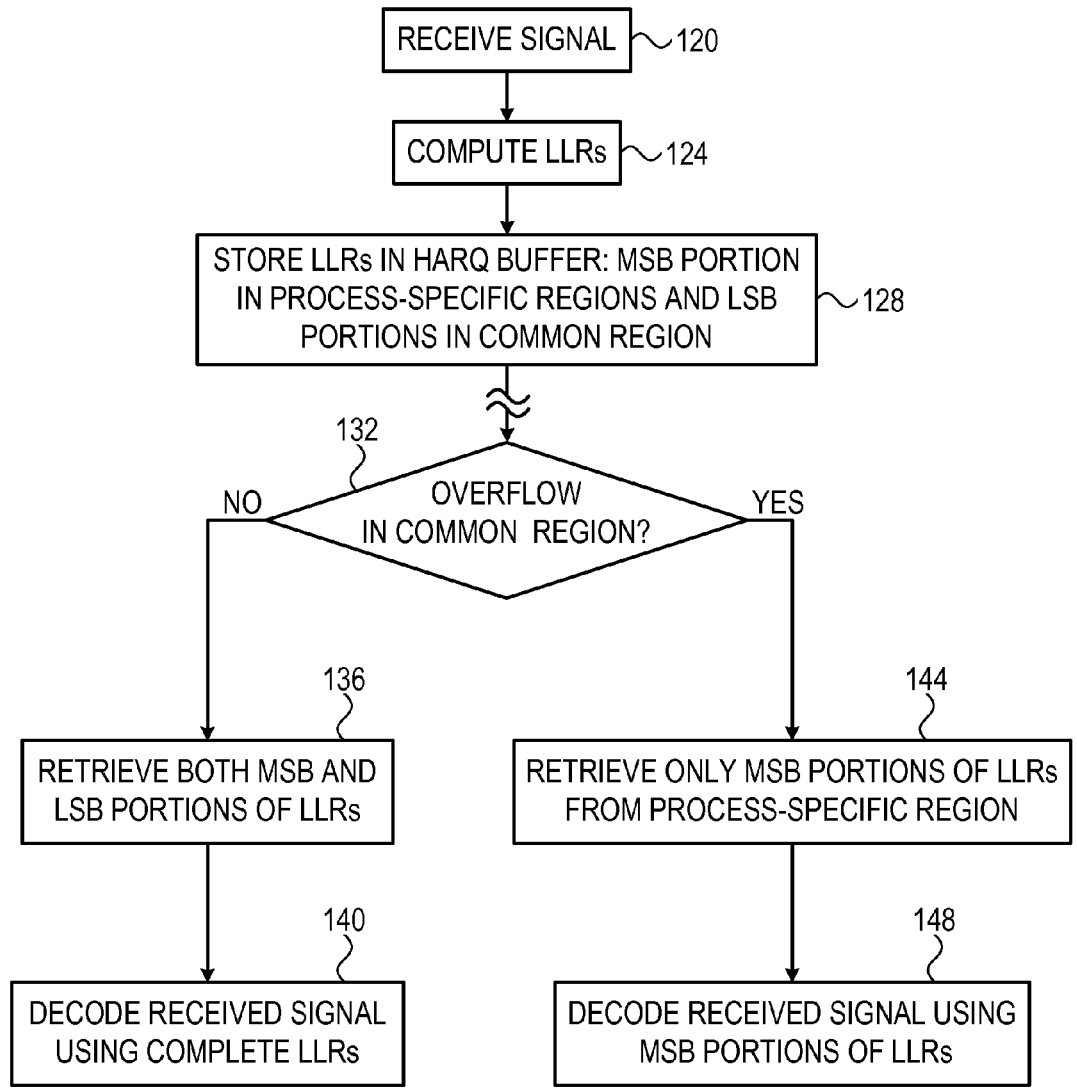
FIG. 5 is a flow chart that schematically illustrates a method for processing soft decoding metrics in a mobile communication terminal, in accordance with an embodiment that is described herein.

FIG. 5 is a flow chart that schematically illustrates a method for processing soft decoding metrics in UE 20 of FIG. 4 above, in accordance with an embodiment that is described herein. The method begins with transceiver 28 receiving a signal that carries data from a base station, at a reception operation 120. Processing circuitry 32 computes LLRs for the data carried by the received signal, at an LLR computation operation 124.

Buffer control unit 106 of processing circuitry 32 divides each LLR into LSB and MSB portions and stores the LLR portions in HARQ buffer 40, at a partitioned storage operation 128. Unit 106 stores the MSB portions in the appropriate process-specific region, and, if space is available, stores the LSB portions in the common region. In one example, the common region comprises "FREE FLAG" indications that indicate to unit 106 whether the respective space in the common region is already used or available.

When the stored LLRs of a given process are needed, buffer control unit 106 checks for overflow in the common region, at a checking operation 132. Typically, unit 106 checks whether the LSB portions of the LLRs are stored in common region 114 or not.

If no overflow is found (i.e., if the LSB portions of the LLRs of the given process are found in the common region), unit 106 retrieves both the MSB portions and the LSB portions of the LLRS from buffer 40, at a full retrieval operation 136. Processing circuitry then decodes the signal using the complete LLRs, including both the MSB and LSB portions, at a complete-LLR decoding operation 140.

If the LSB portions of the LLRs of the given process are not found in common region 114, unit 106 retrieves only the MSB portions of the LLRS from the process-specific region assigned to the given process, at an MSB retrieval operation 144. Processing circuitry 32 then decodes the signal using only the MSB portions and without the LSB portions, at a partial-LLR decoding operation 148.

The UE configurations shown in FIGS. 1 and 4 are example configurations, which are depicted solely for the sake of clarity. In alternative embodiments, any other suitable UE configurations can be used. Some UE elements that are not mandatory for understanding of the disclosed techniques have been omitted from the figures for the sake of clarity. The different UE elements are typically implemented using dedicated hardware, such as using one or more Application-Specific Integrated Circuits (ASICs), Radio frequency Integrated Circuits (RFIC) and/or Field-Programmable Gate Arrays (FPGAs). Alternatively, some UE elements may be implemented using software executing on programmable hardware, or using a combination of hardware and software elements. Memory 36 may comprise any suitable type of memory, e.g., Random Access Memory (RAM).

When implementing the disclosed techniques in software on a programmable processor, the software may be downloaded to the processor in electronic form, over a network, for example, or it may, alternatively or additionally, be provided and/or stored on non-transitory tangible media, such as magnetic, optical or electronic memory. In some embodiments, some elements of UE 20 may be fabricated in a chip-set.

The embodiments described herein refer mainly to downlink operation, i.e., buffering soft decoding metrics that are computed for the downlink signal in a downlink receiver of the UE. The disclosed techniques, however, are not limited to downlink operation and can be used in any suitable receiver that buffers soft decoding metrics. In an example embodiment, the disclosed techniques are used in an uplink receiver of a base station (e.g., NodeB or eNodeB) that buffers soft decoding metrics for uplink signals received from one or more UEs.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
   in a receiver, computing soft decoding metrics for decoding a received signal;
   storing the soft decoding metrics in a compressed form in a memory buffer by defining pointers that point to start and end addresses of respective unoccupied regions in the memory buffer; and
   retrieving the soft decoding metrics in the compressed form from the memory buffer by skipping the unoccupied regions whose start and end addresses are pointed to by the pointers, decompressing the retrieved soft decoding metrics and decoding the received signal using the decompressed soft decoding metrics.

2. The method according to claim 1, wherein storing the soft decoding metrics in the compressed form comprises encoding the soft decoding metrics using a compression codebook.

3. The method according to claim 2, wherein encoding the soft decoding metrics comprises adapting the compression codebook depending on a statistical distribution of the soft decoding metrics.

4. The method according to claim 2, wherein encoding the soft decoding metrics comprises selecting the compression codebook from a plurality of predefined compression codebooks based on a property of the received signal.

5. The method according to claim 1, wherein the receiver comprises a downlink receiver of a mobile communication terminal.

6. The method according to claim 1, wherein the receiver comprises an uplink receiver of a base station.

7. A telecommunication apparatus, comprising:
   a memory, which is configured to hold a memory buffer for storing soft decoding metrics; and
   processing circuitry, which is configured to compute the soft decoding metrics for decoding a received signal, to store the soft decoding metrics in a compressed form in the memory buffer by defining pointers that point to start and end addresses of respective unoccupied regions in the memory buffer, to retrieve the soft decoding metrics in the compressed form from the memory buffer by skipping the unoccupied regions whose start and end addresses are pointed to by the pointers, to decompress the retrieved soft decoding metrics and to decode the received signal using the decompressed soft decoding metrics.

8. The apparatus according to claim 7, wherein the processing circuitry is configured to store the soft decoding metrics in the compressed form by encoding the soft decoding metrics using a compression codebook.

9. The apparatus according to claim 8, wherein the processing circuitry is configured to adapt the compression codebook depending on a statistical distribution of the soft decoding metrics.

10. The apparatus according to claim 8, wherein the processing circuitry is configured to select the compression codebook from a plurality of predefined compression codebooks based on a property of the received signal.

11. A mobile communication terminal comprising the apparatus of claim 7.

12. A base station comprising the apparatus of claim 7.

13. A chipset for processing signals, comprising the apparatus of claim 7.

14. A method, comprising:
   in a receiver, computing soft decoding metrics, wherein each soft decoding metric belongs to one of multiple decoding processes of a received signal;
   in a memory buffer, allocating a common region and multiple process-specific regions corresponding respectively to the decoding processes;
   dividing each soft decoding metric into a most-significant portion and a least-significant portion, storing the most-significant portion in the process-specific region corresponding to a decoding process to which the soft metric belongs, and storing the least-significant portion in the common region; and
   decoding the received signal using at least the most significant portions of the soft decoding metrics stored in the memory buffer.

15. The method according to claim 14, wherein decoding the received signal comprises:
   when the least-significant portions of the soft decoding metrics of a given decoding process are available in the common region, decoding the received signal using both the most-significant portions and the least-significant portions of the soft decoding metrics of the given decoding process; and
   when the least-significant portions of the soft decoding metrics of a given decoding process are not available in the common region, decoding the received signal using only the most-significant portions of the soft decoding metrics of the given decoding process.

16. A telecommunication apparatus, comprising:
   a memory, which is configured to hold a memory buffer for storing soft decoding metrics, wherein each soft decoding metric belongs to one of multiple decoding processes of a received signal; and
   processing circuitry, which is configured to compute the soft decoding metrics, to allocate in the memory buffer a common region and multiple process-specific regions corresponding respectively to the decoding processes, to divide each soft decoding metric into a most-significant portion and a least-significant portion, to store the most-significant portion of each soft decoding metric in the process-specific region corresponding to the decoding process to which the soft metric belongs and to store the least-significant portion of each soft decoding metric in the common region, and to decode the received signal using at least the most significant portions of the soft decoding metrics stored in the memory buffer.

17. The apparatus according to claim 16, wherein the processing circuitry is configured to decode the received signal by:
   when the least-significant portions of the soft decoding metrics of a given decoding process are available in the common region, decoding the received signal using both the most-significant portions and the least-significant portions of the soft decoding metrics of the given decoding process; and
   when the least-significant portions of the soft decoding metrics of a given decoding process are not available in the common region, decoding the received signal using only the most-significant portions of the soft decoding metrics of the given decoding process.

18. A mobile communication terminal or base station comprising the apparatus of claim 16.

19. A chipset for processing signals in a mobile communication terminal, comprising the apparatus of claim 16.

* * * * *